(12) United States Patent
Phan et al.

(10) Patent No.: US 8,028,531 B2
(45) Date of Patent: Oct. 4, 2011

(54) MITIGATING HEAT IN AN INTEGRATED CIRCUIT

(75) Inventors: Khoi A. Phan, San Jose, CA (US); Bharath Rangarajan, Sunnyvale, CA (US); Bhanwar Singh, Morgan Hill, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 4 days.

(21) Appl. No.: 12/537,135

(22) Filed: Aug. 6, 2009

(65) Prior Publication Data
US 2009/0288425 A1    Nov. 26, 2009

Related U.S. Application Data

(62) Division of application No. 10/790,298, filed on Mar. 1, 2004, now abandoned.

(51) Int. Cl.
*F25B 21/02* (2006.01)
(52) U.S. Cl. .......................... 62/3.7; 62/259.2
(58) Field of Classification Search ............ 62/3.3, 62/3.6, 3.7, 259.2
See application file for complete search history.

(56) References Cited

U.S. PATENT DOCUMENTS

| | | | |
|---|---|---|---|
| 4,278,914 A | 7/1981 | Harper | |
| 5,497,033 A | 3/1996 | Fillion et al. | |
| 5,636,234 A | 6/1997 | Takagi | |
| 5,740,016 A | 4/1998 | Dhindsa | |
| 5,867,990 A | 2/1999 | Ghoshal | |
| 5,940,784 A | 8/1999 | El-Husayni | |
| 5,943,553 A | 8/1999 | Spaeth | |
| 6,098,408 A * | 8/2000 | Levinson et al. | 62/3.2 |
| 6,105,381 A | 8/2000 | Ghoshal | |
| 6,128,188 A | 10/2000 | Hanners | |
| 6,230,497 B1 | 5/2001 | Morris et al. | |
| 6,573,596 B2 | 6/2003 | Saika | |
| 6,588,217 B2 | 7/2003 | Ghoshal | |
| 6,614,109 B2 | 9/2003 | Cordes et al. | |
| 6,727,422 B2 | 4/2004 | Macris | |
| 6,729,383 B1 | 5/2004 | Cannell et al. | |
| 6,739,138 B2 | 5/2004 | Saunders et al. | |
| 6,787,691 B2 | 9/2004 | Fleurial et al. | |
| 6,804,966 B1 | 10/2004 | Chu et al. | |
| 6,882,543 B2 | 4/2005 | Kenny et al. | |
| 6,893,902 B2 | 5/2005 | Cordes et al. | |
| 6,918,178 B2 | 7/2005 | Chao et al. | |
| 6,952,050 B2 | 10/2005 | Kwon | |
| 7,164,077 B2 | 1/2007 | Venkatasubramanian | |
| 7,231,772 B2 | 6/2007 | Bell | |
| 2003/0097845 A1 | 5/2003 | Saunders et al. | |
| 2005/0086948 A1 | 4/2005 | Mike-Rojo et al. | |
| 2006/0054091 A1 | 3/2006 | Speciale et al. | |

FOREIGN PATENT DOCUMENTS

WO    9206561 A1    4/1992

* cited by examiner

*Primary Examiner* — Melvin Jones
(74) *Attorney, Agent, or Firm* — Turocy & Watson, LLP

(57) ABSTRACT

The present invention provides for a system and method for regulating and monitoring heat dissipation of an integrated circuit by employing a heat regulating device with a thermal structure network assembly. Each thermal structure can act as a heat conducting pathway for inducing heat into and/or dissipating heat away from the integrated circuit, thus creating a more uniform temperature gradient across the semiconductor body.

20 Claims, 9 Drawing Sheets

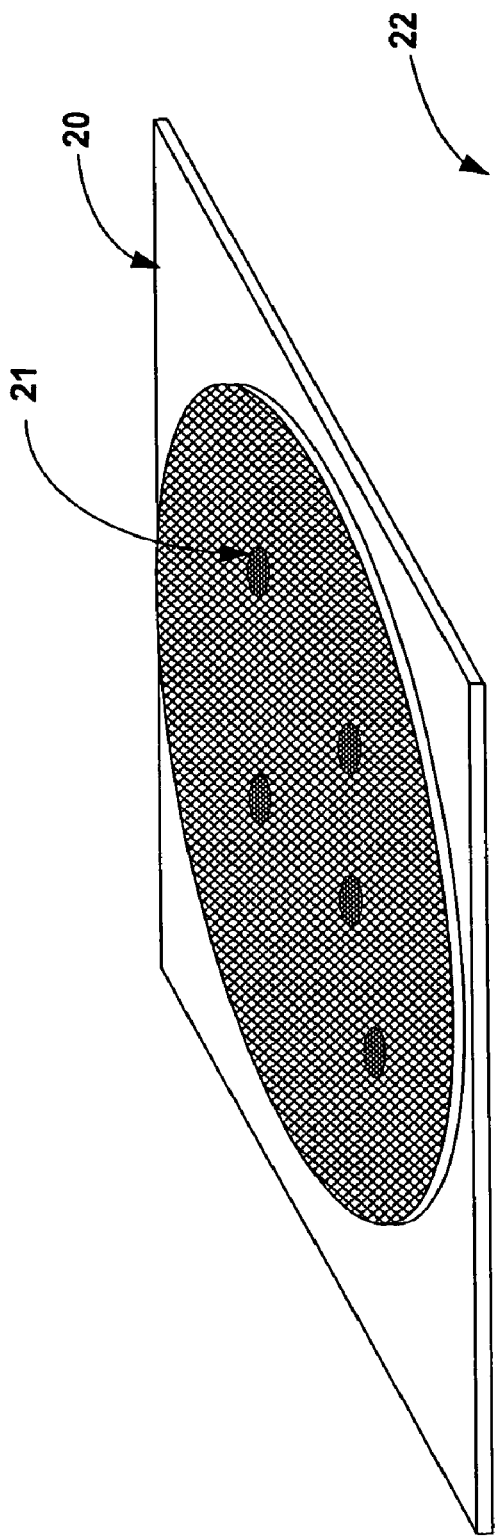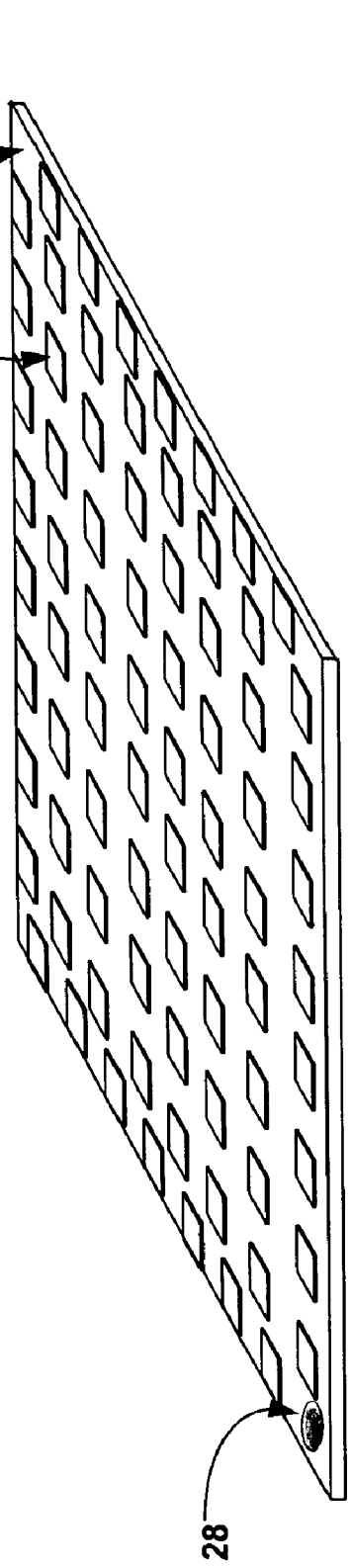
Fig. 2(a)
Fig. 2(b)

MITIGATING HEAT IN AN INTEGRATED CIRCUIT

CROSS-REFERENCE TO RELATED APPLICATIONS

This application is a divisional of U.S. patent application Ser. No. 10/790,298, filed Mar. 1, 2004, entitled "HEAT REGULATING DEVICE FOR AN INTEGRATED CIRCUIT", the entirety of which is incorporated herein by reference.

FIELD OF THE INVENTION

The invention described below generally relates to systems and methods for regulating heat in an integrated circuit device. (e.g. dissipating heat from hot spots, inducing heat into other areas of an integrated circuit device) and more particularly to a heat regulating device that facilitates such heat regulation.

BACKGROUND

Integrated semiconductor devices (IC's) or semiconductor devices are devices including small electronic circuits formed on a surface of a semiconductor wafer. These IC's or semiconductor devices are often fabricated in plurality on the wafer surface, or as part of a wafer. The wafer is then subdivided into discrete IC or semiconductor device chips or dice, and then further tested and assembled for customer use through various well-known individual die testing and packaging techniques. Depending upon size of the IC or semiconductor device and size of the wafer, a wafer may be divided into a few dice or as many as several hundred or more than one thousand discrete dice. The discrete IC or semiconductor device may be subsequently packaged in a variety of manners using lead frames, substrates, or similar processes.

As demand for electrical systems that operate at faster speeds, occupy less space, and provide more functionality increases, the size of associated integrated circuits typically decrease. Manufacturers, thus lean toward designs that employ increasingly more powerful modules containing numerous components that are placed in relatively close proximity on an integrated circuit board.

Accordingly, because of reduced over all form factors, the heat generated from the integrated circuit's microelectronics devices for a given unit of surface area per unit time increases leading to high temperatures in the device. These increased temperatures can potentially damage components of the integrated circuit, or reduce lifetime of the integrated circuit. Therefore, large amounts of heat produced by many such integrated circuits must be dissipated and accounted for in designing the integrated circuit mounting and packaging devices.

At the same time, the generated heat across such a chip is not uniformly distributed, since it contains both low power and high power circuits. Because high power circuits typically generate more heat than low power circuits, a temperature gradient across such a chip is not uniform and "hot-spots" are created. These localized "hot-spots" result in non-uniform heat distribution across the semiconductor body, which in turn can cause excessive, concentrated and non uniform chip stresses, leading eventually to chip failure.

Prior attempts to combat localized heating involve powering off (disabling) various functional units, which are not required for certain operations as to prevent potential fatal destruction. Strategically placed units may alleviate some localized heating problems, however, as chip densities increase and performance of computational-intense programs and operations require functional units to operate relatively non-stop, placement or layout on the chip has little or no effect. Typical implementations for powering off units involve a central controlling unit that disables functional units not required based on incoming/upcoming instructions or operations.

Other attempts have focused on adding multiple functional units and using each of the functional units in some alternating fashion. Even with such techniques, localized heating problems still remain with each functional unit as actual power dissipates within the neighborhood area or space of that unit.

SUMMARY OF THE INVENTION

The following presents a simplified summary of the invention in order to provide a basic understanding of one or more aspects of the invention. This summary is not an extensive overview of the invention. It is not intended to identify key or critical elements of the invention, or to delineate the scope of the present invention. Rather, the sole purpose of this summary is to present some concepts of the invention in a simplified form as a prelude to the more detailed description that is presented later.

The present invention is directed to a system and method for regulating and monitoring heat dissipation of a semiconductor device, in particular to removing generated heat from hot spot areas and/or inducing heat at other areas of the semiconductor chip to facilitate providing for a uniform temperature gradient across a semiconductor body.

According to one aspect of the present invention, regulating and monitoring the integrated circuit's heat dissipation is accomplished by employing an assembly of thermo-electrical structures spread on the surface of a heat regulating device. This spreading assembly can couple with hot spots generated at a portion of the semiconductor chip that rests on a heat regulating device. Accordingly, each one of the thermo-electrical structures of the spreading assembly provides for a heat conducting path that can dissipate heat from the hot spots and into the various heat conducting layers, or associated heat sinks, of the heat regulating device. Likewise, each one of the thermo-electrical structure can act as a heat induction path to induce heat in various regions of the semiconductor, thus creating a more uniform temperature gradient throughout the semiconductor body. This can typically reduce accumulation and concentration of stress that adversely affects the semiconductor body.

In one aspect according to the present invention the thermo-electrical structure is a portion of the conductive body of the heat regulating device itself, which is embedded with various electronic components to monitor and regulate the heat flow into and out of the various regions of the semiconductor chip. In another aspect according to the present invention, the thermo-electrical structure can be a trough formed on the surface of the heat regulating device, with various electronic components embedded therein. Each thermo-electrical structure can be physically, thermally or electrically attached to the body or a surface of the heat regulating device. The thermo-electrical structure can further include various electronic circuitry and components in a variety of planar or three dimensional arrangements as to monitor, regulate and over all manage heat flow away and into the semiconductor body of the integrated circuit. Moreover, in another aspect according to the present invention a number of the thermo-electrical structures are operatively connected to one another as to form a spreading assembly, which sits beneath the bottom portion of the integrated circuit.

Furthermore, each thermo-electrical structure can have the shape of a spiral, twister, corkscrew, maze, or other structural shapes with a denser pattern distribution of lines in one portion and a relatively less dense pattern distribution of lines in other portions. The thermo-electrical structures can include further electronic circuitry to monitor the heat flow and temperature of a desired semiconductor region as a function of; the power output, location of the region where heat is flowing in or out of, and other physical variables associated with the semiconductor or the electric current.

Additionally, the thermo-electrical structure assembly can be a composite composed of a layer having various portions, each tailored to the heat-generating characteristics of the various regions of the semiconductor. For example, one portion may be formed of a material that provides relatively high isotropic conductivity and another portion may be formed of a material that provides high thermal conductivity in another direction.

Another aspect of the invention provides for a heat regulating device with a base or back plate that can be kept in direct contact with a hot spot region of the semiconductor. The base plate can include a heat promoting section and main base plate section. The heat promoting section is for promoting heat transfer between the semiconductor device and the heat regulating device. The main base plate section has the thermo-electrical structures embedded inside. This permits for the heat generated from a semiconductor component to be initially diffused or dispersed through the whole main base plate section and then into the thermo-electrical structure assembly. In another aspect according to the present invention the spreading assembly is connected to a heat sink.

Another version of the invention provides for a semiconductor device that is integrated with the heat regulating device and the thermo-electrical structures are positioned in the regions where hot spots are anticipated, such as beneath the components of the integrated circuit that have a high power dissipation rate.

In another aspect of the invention, the assembly of thermo-electrical structures is connected to form a network with its operation controlled by a controller. In response to data gathered by the thermo-electrical structure assembly, the controller determines which thermal structure should direct heat into or take heat out of the semiconductor body, so that the hot spots are eliminated and a more uniform temperature gradient is achieved in the semiconductor.

To the accomplishment of the foregoing and related ends, certain illustrative aspects of the invention are described herein in connection with the following description and the annexed drawings, which are not to scale. These aspects are, however, indicative of but a few of the various ways in which the principles of the invention may be employed. Other aspects, advantages and novel features of the invention may become apparent from the following detailed description of the invention when considered in conjunction with the drawings.

BRIEF DESCRIPTION OF THE DRAWINGS

FIGS. 2(a) and 2(b) illustrate the corresponding perspective assembly layout of the thermo-electrical structure on the surface of the heat regulating device relative to the hot spots according to a version of the invention

DESCRIPTION OF THE INVENTION

Figure 1:
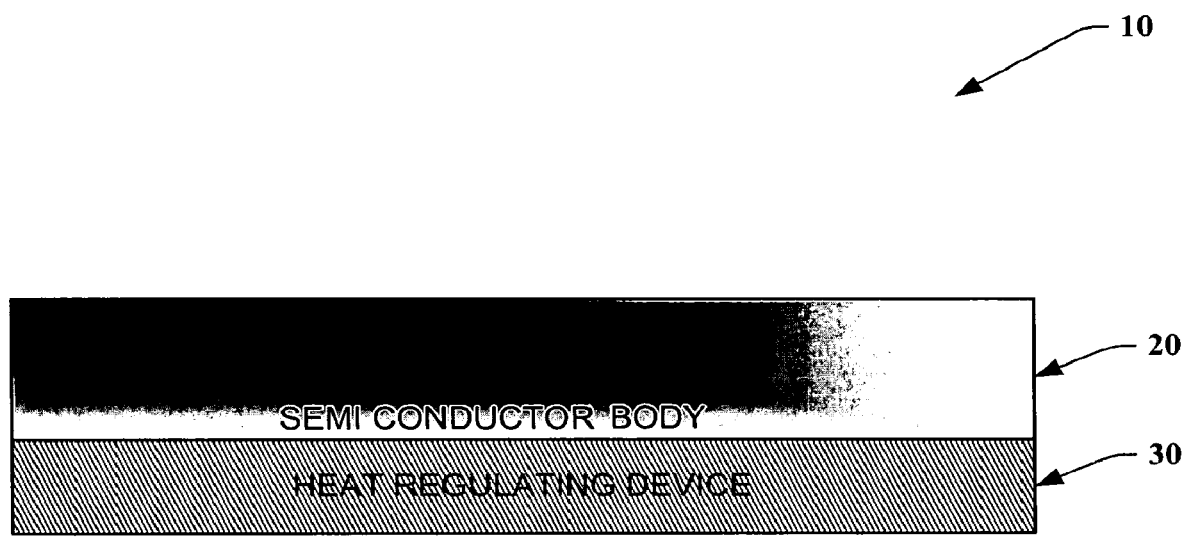
FIG. 1 is a cross sectional view illustrating generally the integrated circuit and the heat regulating device.

The various aspects of the present invention will now be described with reference to the drawings. The invention provides a system and methodology for regulating and monitoring heat dissipation of a semiconductor device, by employing an assembly of thermo-electrical structures that in part form a heat regulating device.

As used in this application, the term "computer component" or "system" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers.

As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

The subject invention (e.g., in connection with choosing region(s) for heating and/or dissipating heat) can employ various artificial intelligence based schemes for carrying out various aspects of the subject invention. For example, a process for determining which region to be selected can be facilitated via an automatic classification system and process. Such classification can employ a probabilistic and/or statistical-based analysis (e.g., factoring into the analysis utilities and costs) to prognose or infer an action that is desired to be automatically performed. For example, a support vector machine (SVM) classifier can be employed. A classifier is a function that maps an input attribute vector, x=(x1, x2, x3, x4, xn), to a confidence that the input belongs to a class—that is, f(x)=confidence(class). Other classification approaches include Bayesian networks, decision trees, and probabilistic classification models providing different patterns of independence can be employed. Classification as used herein also is inclusive of statistical regression that is utilized to develop models of priority.

As will be readily appreciated from the subject specification, the subject invention can employ classifiers that are explicitly trained (e.g., via a generic training data) as well as implicitly trained (e.g., via observing system behavior, receiving extrinsic information) so that the classifier(s) is used to automatically determine according to a predetermined criteria which regions to choose. For example, with respect to SVM's which are well understood—it is to be appreciated that other classifier models may also be utilized such as Naive Bayes, Bayes Net, decision tree and other learning models—SVM's are configured via a learning or training phase within a classifier constructor and feature selection module.

Referring initially to FIG. 1, an exemplary cross sectional view for a heat regulation system 10 is illustrated according to one aspect of the subject invention. The integrated circuit package 20 that has developed a non-uniform temperature gradient is in contact with a heat regulating device 30. Although each of the two layers 20 and 30 are shown to be essentially equal in thickness, this does not have to be the case and the invention is not so limited. The integrated circuit 20 is fabricated from a semiconductor wafer comprising, for example, a layer of silicon (Si), gallium arsenide (Ga—As), or silicon germanium (Si—Ge) or the like, having a standard thickness on which is deposited a high thermal conductive layer of either .beta.-SiC or diamond or a combination of both. Typically, the thermal conductivity of the crystal silicon is temperature dependent and can be governed by the temperature dependence of the phonon specific heat and the rates of phonon scattering on other phonons, impurities, defects, charge carriers, boundaries, and dislocations. The integrated circuit 20 is capable of generating hot spots during the operation of its electronic device, for example through its high power transistor circuits, bipolar transistors and similar high powered components. Likewise, the heat regulating device 30 can be fabricated from the combination of various layers of silicon carbide and diamond or the like.

Referring now to FIG. 2(a), a perspective assembly layout of the integrated circuit is illustrated. According to one aspect of the invention, hot spots are generated throughout the semiconductor body and appear as localized spots 21 on various surfaces of the integrated circuit. FIG. 2(b) illustrates the heat regulating device 30 having a plurality of thermo-electrical structures. Each thermo-electrical structure 26 can be connected to other thermo-electrical structures as to form a spreading assembly 22 that spreads on the surface of the heat regulating device. Accordingly, each thermo-electrical structure can perform as a heat conducting path that can dissipate heat from the hot spot(s) 21 and into the various heat conducting layers of the heat regulating device, or the associated heat sinks. In one aspect according to the present invention, the thermo-electrical structure can act as a heat induction path to induce heat into various regions of the semiconductor device 20. This heat induction can create a more uniform temperature gradient throughout the semiconductor body 20, and can typically reduce the accumulation and concentration of stress that adversely affects the performance of the integrated circuit. When the integrated circuit 20 rests on the heat regulating device 30, the associated "hot-spots" of the integrated package couple with the respective thermal structures. According to one aspect of the present invention, the thermo-electrical structure can be a trough formed within the surface layer of the heat regulating device, and embedded with various electronic components. In another aspect according to the subject invention, the thermo-electrical structure can be an external element that attaches to the surface of the heat regulating device. Moreover, a component 28 of the heat regulating device can act as a heat sink that is connected to the network of thermo-electrical structures.

Figure 3:
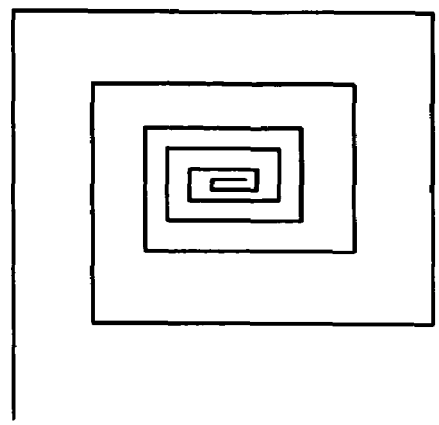
FIG. 3 is a schematic diagram illustrating a plan view of the thermo electrical structures according to one or more aspects of the invention.
Figure 3:
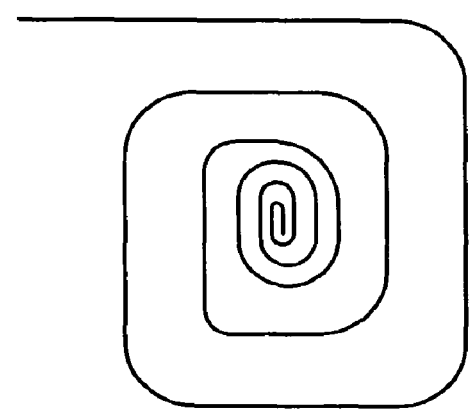
Figure 3:
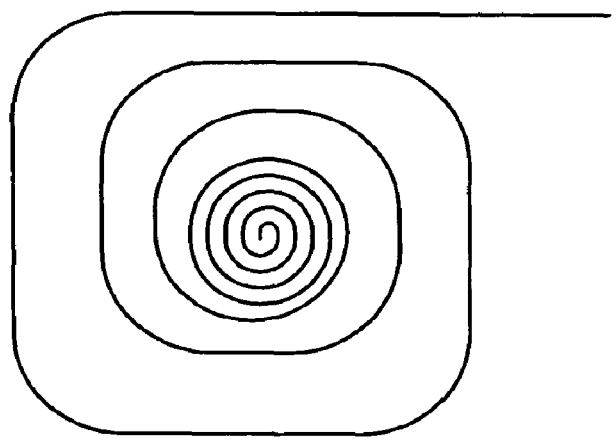

FIG. 3, illustrates several patterns for the thermo-electrical structure according to various aspects of the present invention. These include a "maze-shaped" pattern and a helix structure with a denser distribution of line patterns towards the center and a less dense distribution of lines towards the outer limits. According to one aspect of the present invention, various electronic circuitry and components can be embedded into this spreading assembly in a variety of planar or three dimensional arrangements to gather, monitor, regulate and over all manage the heat flow away from and/or into the semiconductor body. In addition, measuring devices can be embedded in to the thermo-electrical structure for measuring various physical properties of the semiconductor body.

Figures 4, 5:
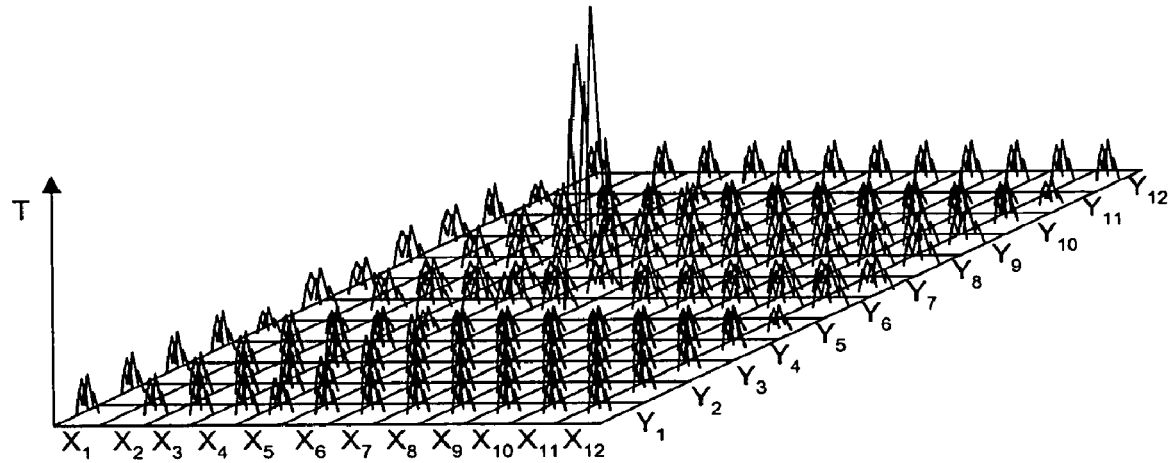
FIG. 4 is a representative three dimensional grid map of a wafer surface illustrating temperature amplitudes taken at grid blocks of the grid map according to the present invention.
FIG. 5 is a temperature amplitude table correlating the temperature amplitudes of FIG. 4 with desired values for the temperature amplitudes in accordance with an aspect of the invention.

The semiconductor 20 may be divided into an exemplary grid pattern as that shown in FIG. 4. Each grid block (XY) of the grid pattern corresponds to a particular portion of a semiconductor 20, and each portion can be individually monitored and controlled for temperature via the control system described below with reference to FIG. 7. In one exemplary aspect, there is one thermo-electrical structure for each temperature measured, allowing the temperatures of the various regions to be controlled individually. In FIG. 4, the temperature amplitudes of each semiconductor portion ($X_1Y_1 \ldots X_{12}$, $Y_{12}$) are shown with each respective portion of the semiconductor being monitored for temperature using a respective thermo-electrical structure. Typically, the temperature of the semiconductor at a coordinate (e.g. $X_3Y_9$) that lies beneath an electronic component having a high dissipation rate, is substantially higher than the temperature of the other semiconductor portions XY. Similarly, during the operation of the integrated circuit, the temperature of a region of the semiconductor body may reach an unacceptable limit (Tu). The activation of a respective thermo-electrical structure for that region can lower the temperature to the acceptable value (Ta). Accordingly, in one aspect according to the invention, several thermo-electrical structures may manage heat flow from such a region to reach an acceptable temperature for the region.

FIG. 5 is a representative table of temperature amplitudes taken at the various grid blocks, which have been correlated with acceptable temperature amplitude values for the portions of the semiconductor 20 mapped by the respective grid blocks. This data can then be used by the control system of FIG. 7 to determine the grid blocks with undesired temperature outside the acceptable range (Ta range). Subsequently, the undesired temperatures can be brought to an acceptable level via activation of the respective thermo-electrical structure(s).

Figure 6:
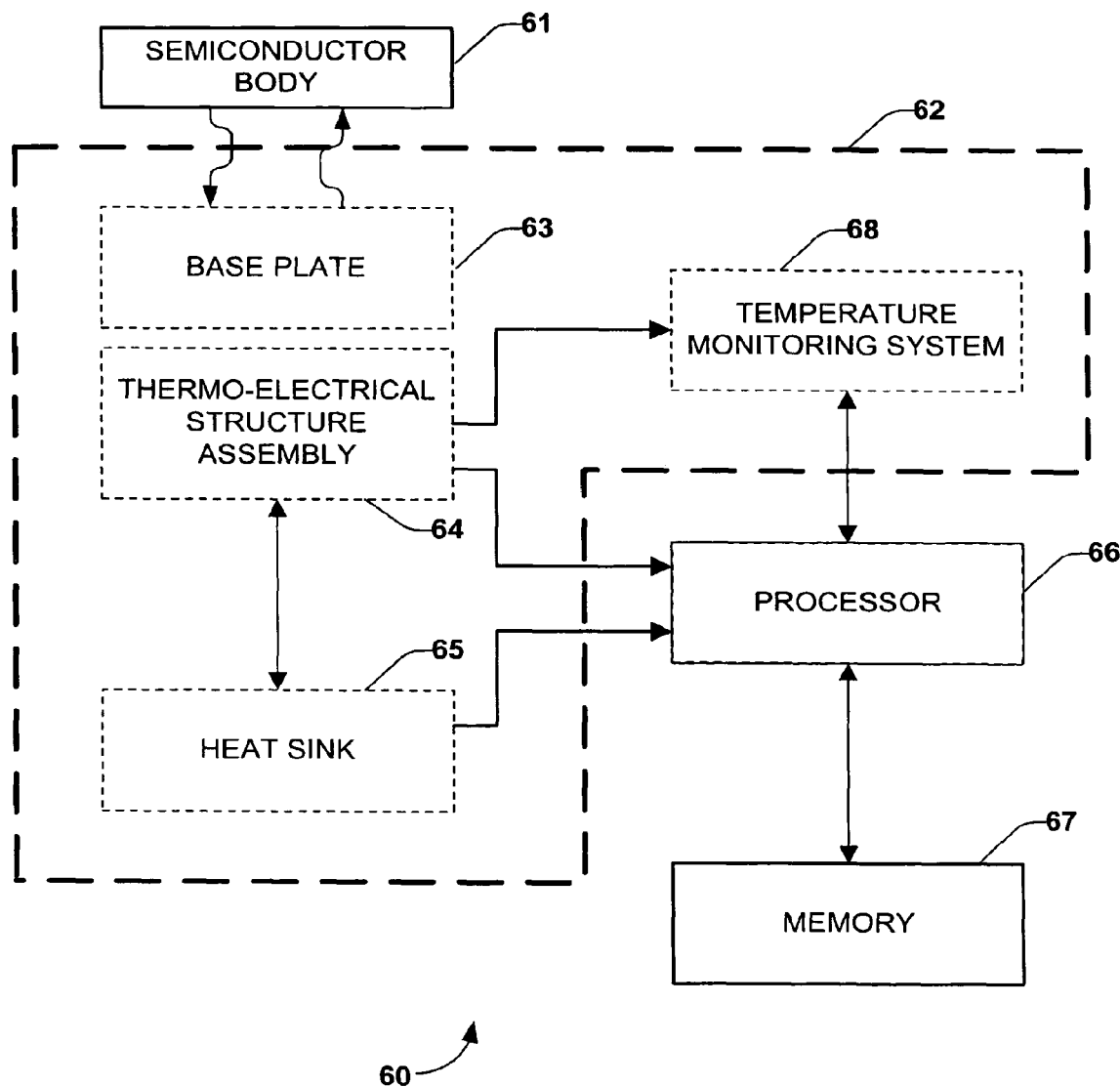
FIG. 6 is a schematic block diagram of a heat regulation system according to one aspect of the invention.

Referring now to FIG. 6, a schematic block diagram of a heat regulation system according to one aspect of the invention is illustrated. The system 60 includes a heat regulating device 62, which further comprises a thermo-electrical network assembly 64 operatively coupled to a back plate 63 that interacts with the semiconductor body 61. The thermo-electrical net work assembly 64 consists of a plurality of thermo-electric structures, (such as that described above), and can be operatively coupled to the heat sink 65, which draws heat away from the thermo-electrical structure assembly 64. Also, the thermo-electrical structure assembly 64 can be physically, thermally, or electrically connected to the back plate, which in turn contacts the semiconductor device. This version of the invention allows the semiconductor device to interact with thermo-electrical structure assembly 64 as a whole, via the back plate, as opposed to a portion of the semiconductor body interacting with a respective individual thermo-electrical structure unit. A processor 66 can be operatively coupled to the thermo-electrical network assembly 64 and be programmed to control and operate the various components within the heat regulating device 62. At the same time, a temperature monitoring system 68 can be operatively connected to the processor 66 and the semiconductor 61, (via the back plate 63). The temperature monitoring system 68 operates to monitor temperature of the integrated circuit 61. Temperature data are then provided to the processor 66, which employs these data in controlling the heat regulating device 62. The processor 66 can be part of an intelligent device that has the ability to sense or display information, or convert analog information into digital, or perform mathematical manipulation of digital data, or interpret the result of mathematical manipulation, or make decisions on the basis of the information. As such, the processor can be part of a logic unit, a computer or any other intelligent device capable of making decisions based on the data gathered by the thermo-electrical structure and the information provided to it by the heat regulating device. A memory 67 being coupled to the processor 60 is also included in the system 60 and serves to store program code executed by the processor 66 for carrying out operating functions of the system 60 as described herein. The memory 67 can include read only memory (ROM) and random access memory (RAM). The ROM contains among other code the Basic Input-Output System (BIOS) which controls the basic hardware operations of the system 60. The RAM is the main memory into which the operating system and application programs are loaded. The memory 67 also serves as a storage medium for temporarily storing information such as semiconductor temperature, temperature tables, allowable temperature, properties of the thermo-electrical structure, and other data employed in carrying out the present invention. For mass data storage, the memory 67 may include a hard disk drive (e.g., 10 Gigabyte hard drive).

Figure 7:
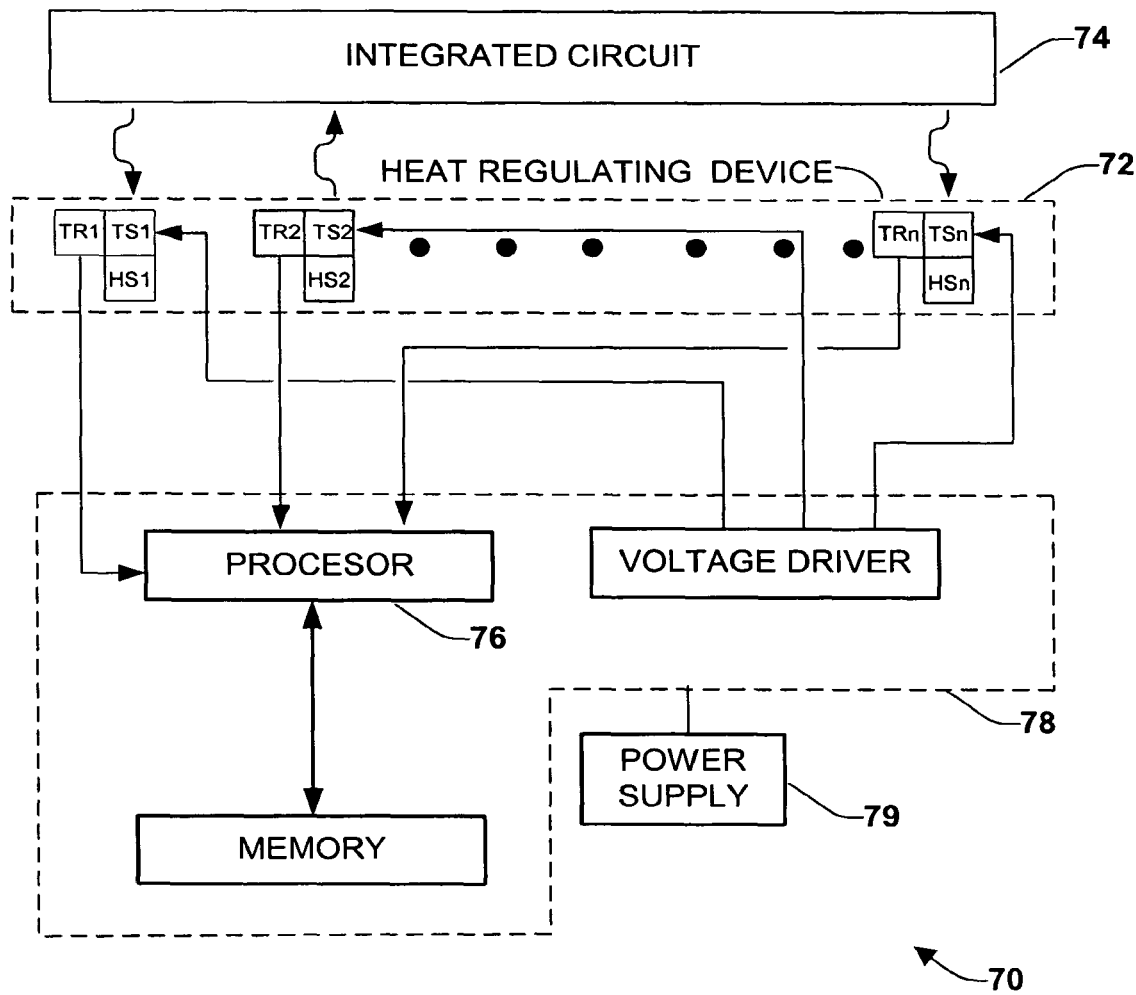
FIG. 7 is detailed schematic diagram illustrating another system for controlling the temperature of the integrated circuit according to one aspect of the present invention.

In one aspect according to the present invention, during a typical operation of the semiconductor device the location of the hot spots are anticipated, or determined via temperature monitoring, and the corresponding thermo-electrical structure that matches the hot spots is activated as to take away the heat from the hot spot regions and/or induce heat to other regions of the semiconductor body to create a uniform temperature gradient. FIG. 7 illustrates a detailed schematic diagram illustrating such a system for controlling the temperature of the integrated circuit according to this exemplary aspect. The system 70 includes a plurality of thermo-electrical structures (TS1, TS2 . . . TS[N]), wherein "N" is an integer. In one aspect, the thermoelectric structures TS are preferably distributed along the surface of the heat regulating device 72 so as to uniformly cover its surface. Each thermo-electrical structure provides a heat path to a predetermined portion of the semiconductor body 74 respectively. A plurality of heat sinks (HS1, HS2, . . . HS[N]) are provided, wherein each heat sink HS is operatively coupled to a corresponding thermo-electrical structure TS, respectively, to draw heat away from the semiconductor body. The system 70 also includes a plurality of thermistors (TR1, TR2, . . . TR[N]). Each thermo-electrical structure TS can have a corresponding thermistor TR for monitoring temperature of the respective portion of the semiconductor body 74 being temperature regulated by the corresponding thermo-electrical structure. In one aspect of the present invention, the thermistor TR may be integrated with the thermo-electrical structure TS. Each thermistor TR is operatively coupled to the processor 76 to provide it with temperature data associated with the respective monitored region of the semiconductor body. Based on the information received from the thermistors as well as other information (e.g., anticipated location of the hot spots, properties of the semiconductor body), the processor 76 drives the voltage driver 79 operatively coupled thereto to control the thermo-electrical structure in a desired manner to regulate the temperature of the semiconductor device 74.

The microprocessor can be part of a control unit 78 that has the ability to sense or display information, or convert analog information into digital, or perform mathematical manipulation of digital data, or interpret the result of mathematical manipulation, or make decisions on the basis of the information. As such, the control unit can be logic unit, a computer or any other intelligent device capable of making decisions based on the data gathered by the thermo-electrical structure and the information provided to it by the heat regulating device. The control unit 78 designates which thermo-electrical structures should be taking away heat from the hot spots, and/or which thermo-electrical structure should induce heat into the semiconductor body and/or which one of the thermo-electrical structures should remain inactive. The heat regulating device provides the control unit with data gathered continuously by the thermo-electrical structures about various physical properties of the different regions of the semiconductor body, such as, temperature, power dissipation and the like. In addition, a suitable power supply 79 provides operating power to the control unit 78.

Based on the data provided, the control unit 78 makes a decision about the operation of the various portions of the thermo-electrical structure assembly, e.g. deciding what number of the thermo-electrical structures should dissipate heat away and from which hot spots, and which ones should induce heat to create a more uniform temperature gradient across the integrated circuit. Accordingly, the control unit 78 controls the heat regulating device 72, which in turn adjusts the heat flow away from and/or into the semiconductor body 74. In another aspect according to the present invention the semiconductor device 74 is coupled together with the heat regulating device 72, by techniques such as brazing, pressure welding by forging, deformation together with intermeshing and any combination thereof. Such construction permits the heat regulating device to directly contact the semiconductor body, so that heat generated from the electronic components of the integrated circuit may be effectively regulated.

Figure 8:
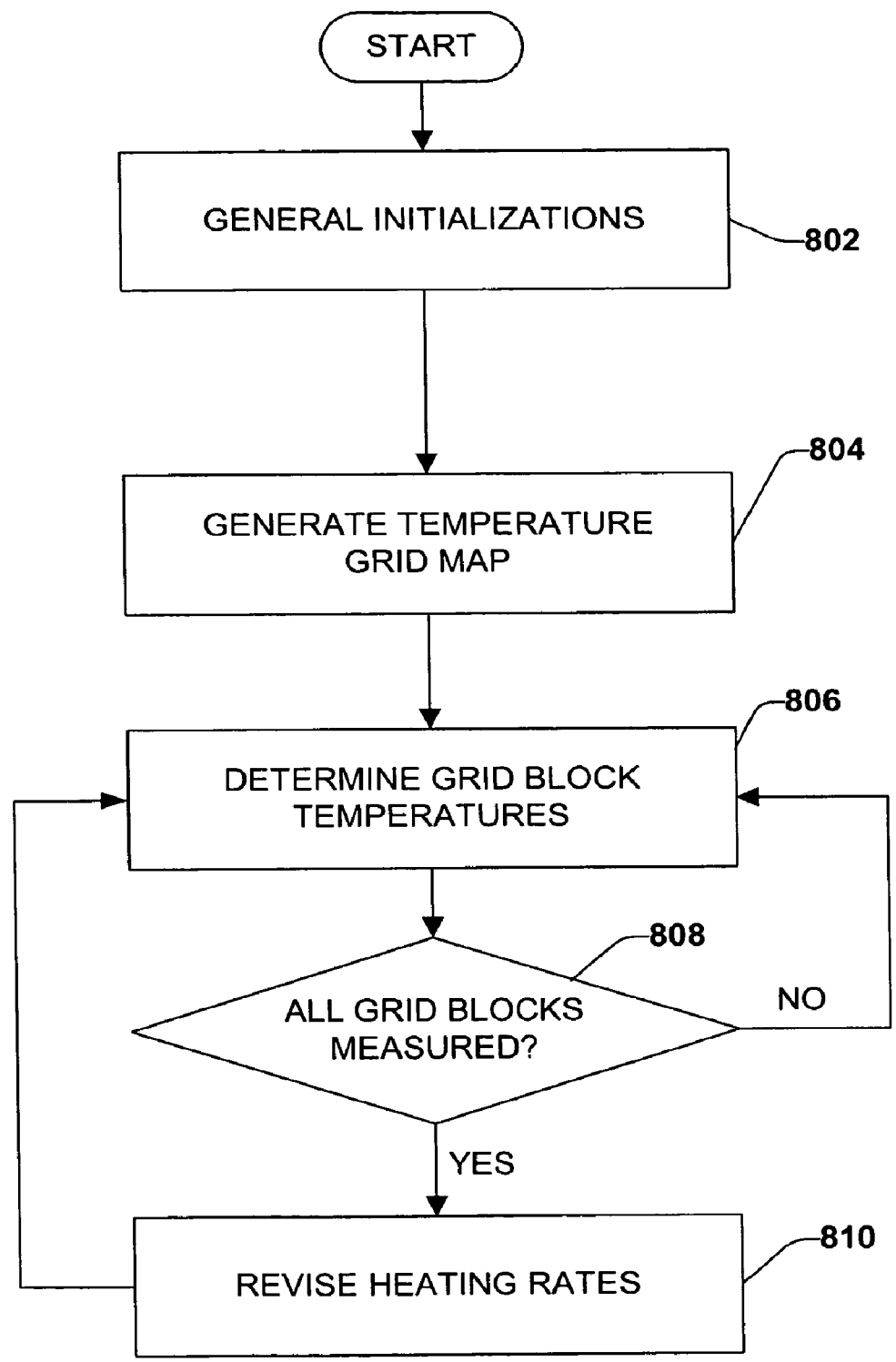
FIG. 8 is a flow diagram illustrating a methodology for regulating the heat transfer of the wafer according to one aspect of the present invention.

Referring now to FIG. 8, a flow diagram illustrates another particular methodology for carrying out the present invention. In step 802, the processor 76 performs general initializations to the semiconductor body. In step 804, the semiconductor body is mapped into grid blocks XY, as previously described with reference to FIG. 4 and FIG. 5. In step 806, temperature determinations are made with respect to the various integrated circuit portions mapped by the respective grid blocks XY. In step 808, the processor 76 determines if all grid block measurements have been taken. If no, the processor 76 returns to step 806. In step 810, the processor 76 adjusts the function for each thermo-electrical structure in accordance with; the most recently measured temperatures, any temperatures determined during preceding iterations, and target temperature or acceptable temperature levels for the current time all in accordance with the control strategy. The present iteration is then ended and the process returns to step 802 to perform another iteration.

Figure 9:
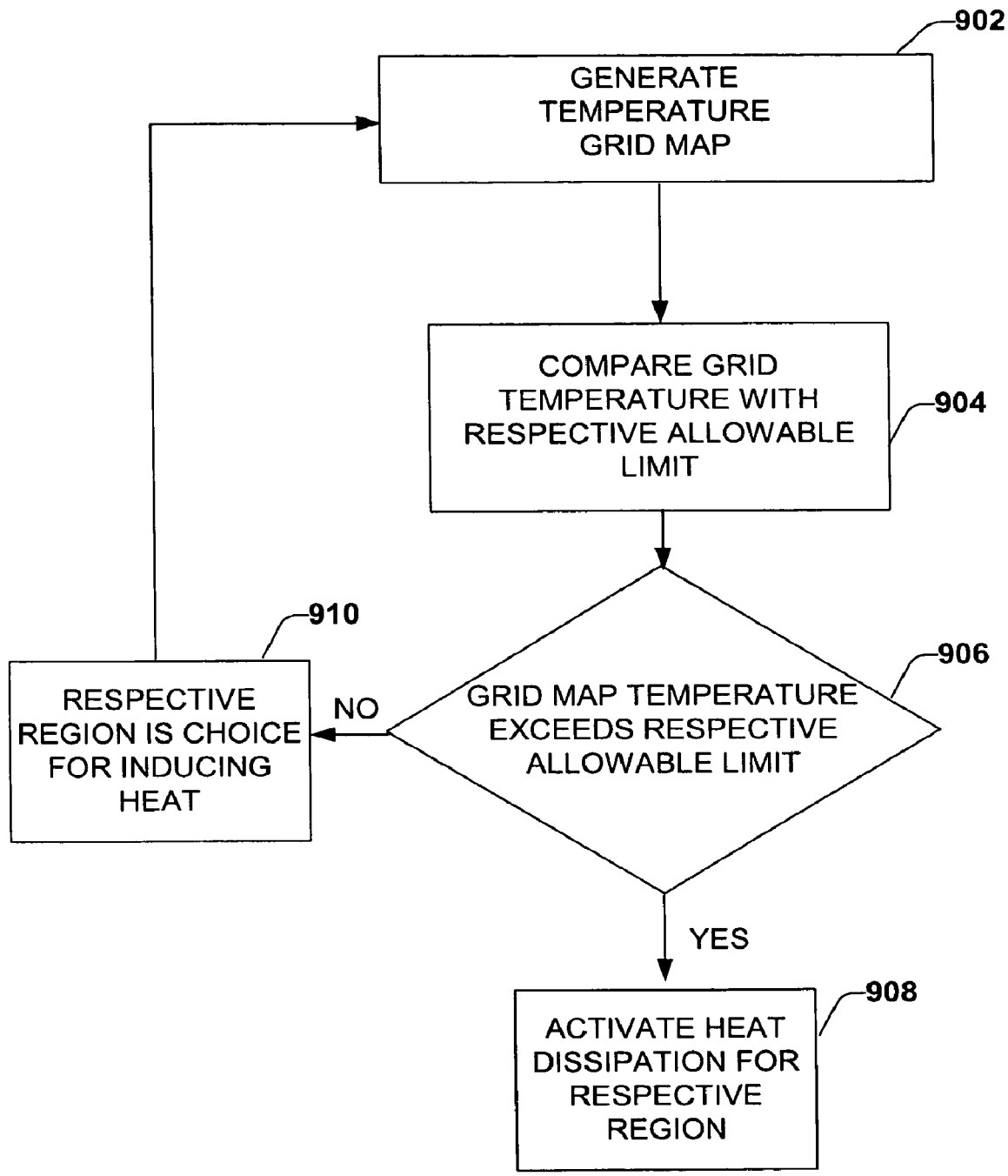
FIG. 9 is another flow diagram illustrating a methodology for regulating the heat transfer of the integrated circuit according to an aspect of the present invention.

FIG. 9 provides another aspect of a flow diagram for carrying out the present invention. In step 902, the logic unit comprising the processor 76 generates the temperature grid map for the semiconductor body. Next, in step 904, temperature for each region is compared to a respective allowable temperature for that region. In step 906, a determination is made, whether the temperature for the region exceed the respective allowable temperature.

If the temperature for that region exceeds the acceptable temperature of that region at that particular time, i.e. function 908 is selected, the region's respective thermo-electrical structure is activated to dissipate the heat for that region. However, if the temperature is below the acceptable temperature, i.e. function 910 is selected, then the region is considered as a potential choice for inducing heat as to create a more uniform temperature gradient throughout the semiconductor body. Accordingly, at any specific time the logic unit can control from which areas, if any, heat should be dissipated and to which areas, if any, heat should be induced.

Figure 10:
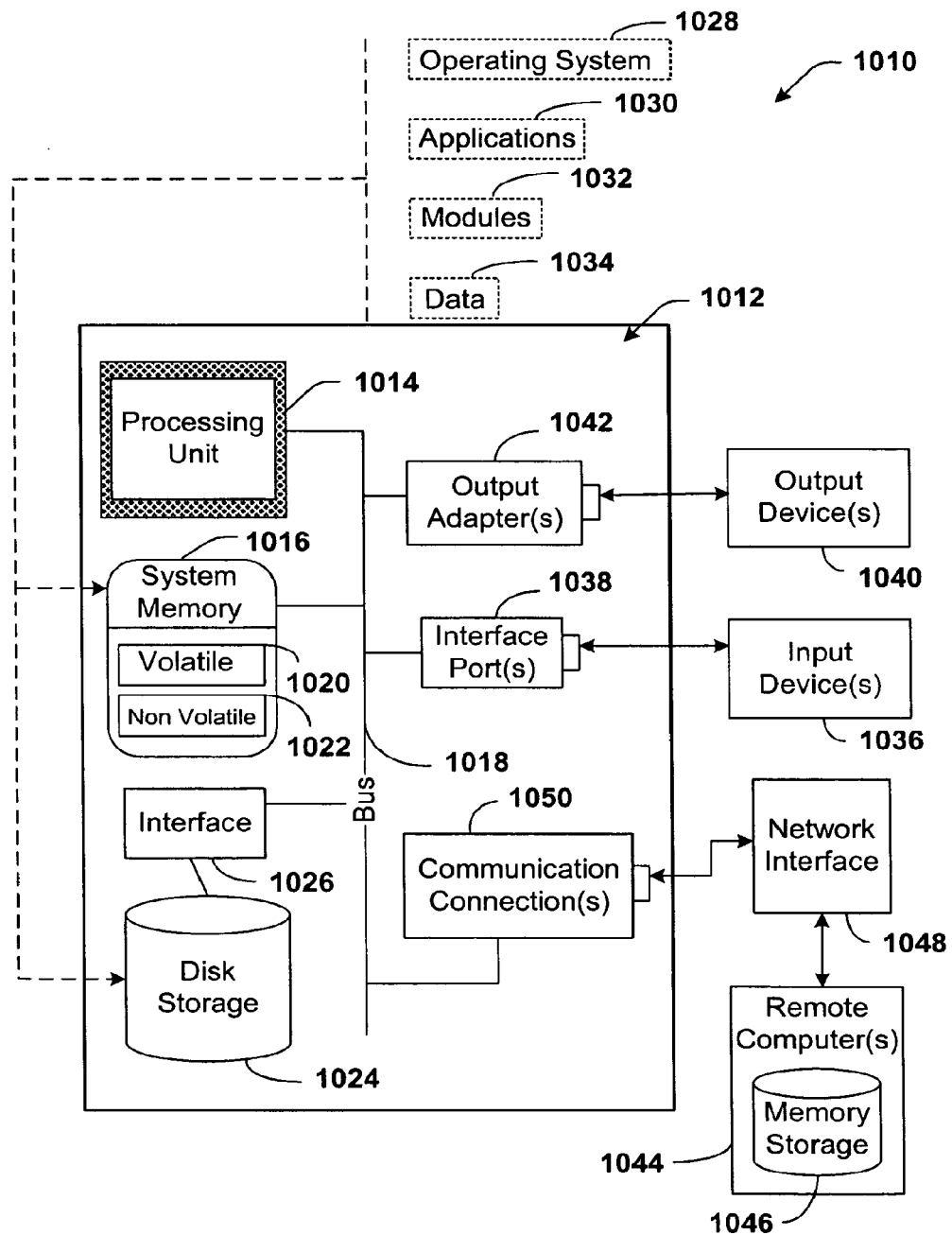
FIG. 10 is a schematic diagram of an exemplary computing environment for various aspects of the subject invention.

With reference to FIG. 10, an exemplary environment 1010 for implementing various aspects of the invention includes a computer 1012. The computer 1012 includes a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014.

The system bus 1018 can be any of several types of bus structure(s) including the memory bus or memory controller, a peripheral bus or external bus, and/or a local bus using any variety of available bus architectures including, but not limited to, an 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCM-CIA), and Small Computer Systems Interface (SCSI).

The system memory 1016 includes volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable ROM (EEPROM), or flash memory. Volatile memory 1020 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1012 also includes removable/nonremovable, volatile/nonvolatile computer storage media. FIG. 10 illustrates, for example a disk storage 1024. Disk storage 1024 includes, but is not limited to, devices like a magnetic disk drive, floppy disk drive, tape drive, Jaz drive, Zip drive, LS-100 drive, flash memory card, or memory stick. In addition, disk storage 1024 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to the system bus 1018, a removable or non-removable interface is typically used such as interface 1026.

It is to be appreciated that FIG. 10 describes software that acts as an intermediary between users and the basic computer resources described in suitable operating environment 1010. Such software includes an operating system 1028. Operating system 1028, which can be stored on disk storage 1024, acts to control and allocate resources of the computer system 1012. System applications 1030 take advantage of the management of resources by operating system 1028 through program modules 1032 and program data 1034 stored either in system memory 1016 or on disk storage 1024. It is to be appreciated that the present invention can be implemented with various operating systems or combinations of operating systems.

A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port may be used to provide input to computer 1012, and to output information from computer 1012 to an output device 1040. Output adapter 1042 is provided to illustrate that there are some output devices 1040 like monitors, speakers, and printers among other output devices 1040 that require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a personal computer, a server, a router, a network PC, a workstation, a microprocessor based appliance, a peer device or other common network node and the like, and typically includes many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1050 refers to the hardware/software employed to connect the network interface 1048 to the bus 1018. While communication connection 1550 is shown for illustrative clarity inside computer 1012, it can also be external to computer 1012. The hardware/software necessary for connection to the network interface 1048 includes, for exemplary purposes only, internal and external technologies such as, modems including regular telephone grade modems, cable modems and DSL modems, ISDN adapters, and Ethernet cards.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for mitigating heat in an integrated circuit, comprising:
    mapping a semiconductor body of the integrated circuit into grid blocks;
    determining a temperature at each grid block; and
    adjusting a function of at least one thermo-electrical structure based at least in part on the determined temperatures, wherein adjusting the function of at least one thermo-electrical structure based at least in part on the determined temperatures is further based at least in part on a target temperature, the adjusting the function of at least one thermo-electrical structure based at least in part on the determined temperatures and the target temperature is further based at least in part on previously determined temperatures, adjusting the function of at least one thermo-electrical structure further comprises activating at least one thermo-electrical structure to induce heat into at least one of the grid blocks.

2. The method of claim 1, wherein adjusting the function of at least one thermo-electrical structure comprises activating the at least one thermo-electrical structure to remove heat from at least one of the grid blocks.

3. The method of claim 2, further comprising:
    repeating the steps of determining the temperature at each grid block and adjusting the function of at least one thermo-electrical structure.

4. The method of claim 3, further comprising:
    training a classification system for predicting the temperatures at the plurality of locations, based at least in part on the repeated determinations of temperature at each grid block, and the adjustments made to the function of thermo-electrical structures.

5. The method of claim 4, further comprising:
    determining which thermo-electrical structures to activate to remove heat using the classification system.

6. The method of claim 1, further comprising:
    training a classification system for predicting the temperatures at the plurality of locations, based at least in part on the repeated determinations of temperature at each grid block, and the adjustments made to the function of thermo-electrical structures.

7. A method for dissipating heat in an integrated circuit, comprising:
    generating a map of a semiconductor body of the integrated circuit;
    measuring a temperature at a plurality of locations on the semiconductor body;
    recording the temperatures at the plurality of locations;
    comparing the measured temperatures to a threshold temperature;
    activating at least one thermo-electrical device to remove heat from a first location of the plurality of locations, the first location having a measured temperature above the threshold temperature;
    observing temperature trends at one or more of the plurality of locations; and
    inferring future temperatures at the plurality of locations, based at least in part on the observing temperature trends.

8. The method of claim 7, wherein the activating further comprises, based upon the inferring future temperatures, activating at least one additional thermo-electrical device to remove heat from a second location of the plurality of locations, the second location having a measured temperature below the threshold temperature.

9. The method of claim 7, further comprising:
    activating at least one other thermo-electrical device to induce heat into at least one other of the plurality of locations, the at least one other location having a measured temperature below the threshold temperature.

10. The method of claim 9, further comprising:
    determining which thermo-electrical devices to activate for removing heat or for inducing heat using an automatic classification system.

11. The method of claim 10, wherein determining which thermo-electrical devices to activate for removing heat or for inducing heat using an automatic classification system comprises using a support vector machine (SVM) classifier.

12. The method of claim 10, wherein determining which thermo-electrical devices to activate for removing heat or for inducing heat using an automatic classification system comprises using at least one of a neural network, a Bayesian network, a decision tree, or a decision graph.

13. A method for mitigating heat in an integrated circuit, comprising:
    mapping a semiconductor body of the integrated circuit into grid blocks;
    determining a temperature at each grid block;
    adjusting a function of at least one thermo-electrical structure based at least in part on the determined temperatures, wherein adjusting the function of at least one thermo-electrical structure based at least in part on the determined temperatures is further based at least in part on a target temperature, and the adjusting the function of at least one thermo-electrical structure based at least in part on the determined temperatures and the target temperature is further based at least in part on previously determined temperatures, the adjusting the function of at least one thermo-electrical structure comprises activating the at least one thermo-electrical structure to remove heat from at least one of the grid blocks; and
    repeating the steps of determining the temperature at each grid block and adjusting the function of at least one thermo-electrical structure
    training a classification system for predicting the temperatures at the plurality of locations, based at least in part on the repeated determinations of temperature at each grid block, and the adjustments made to the function of thermo-electrical structures.

14. The method of claim 13, further comprising:
determining which thermo-electrical structures to activate to remove heat using the classification system.

15. The method of claim 13, wherein adjusting the function of at least one thermo-electrical structure further comprises activating at least one thermo-electrical structure to induce heat into at least one of the grid blocks.

16. The method of claim 14, wherein adjusting the function of at least one thermo-electrical structure further comprises activating at least one thermo-electrical structure to induce heat into at least one of the grid blocks.

17. The method of claim 15, further comprising:
determining which thermo-electrical structures to activate to remove heat using the classification system.

18. The method of claim 8, further comprising:
activating at least one other thermo-electrical device to induce heat into at least one other of the plurality of locations, the at least one other location having a measured temperature below the threshold temperature.

19. The method of claim 18, further comprising:
determining which thermo-electrical devices to activate for removing heat or for inducing heat using an automatic classification system.

20. The method of claim 19, wherein determining which thermo-electrical devices to activate for removing heat or for inducing heat using an automatic classification system comprises using a support vector machine (SVM) classifier.

* * * * *